United States Patent [19]
Ortiz

[11] Patent Number: 5,287,372
[45] Date of Patent: Feb. 15, 1994

[54] QUASI-RESONANT DIODE DRIVE CURRENT SOURCE

[75] Inventor: Joe A. Ortiz, Garden Grove, Calif.

[73] Assignee: Hughes Aircraft Company, Los Angeles, Calif.

[21] Appl. No.: 873,464

[22] Filed: Apr. 24, 1992

[51] Int. Cl.$^5$ .............................................. H01S 3/00
[52] U.S. Cl. ...................................... 372/38; 372/25; 372/33; 372/92
[58] Field of Search ........................ 372/38, 92, 25, 33

[56] References Cited

FOREIGN PATENT DOCUMENTS 6296572  12/1987  Japan ..................................... 372/38

OTHER PUBLICATIONS

Hoang Le-Huy, "A Current-Controlled Quasi-Resonant Converter for Switched-Reluctance Motor", IEEE Transactions on Industrial Electronics, vol. 38, No. 5, Oct. 1991.

Raymond B. Ridley, "Multi-Loop Control for Quasi-Resonant Converters," IEEE Transactions on Power Electronics, vol. 6, No. 1, Jan. 1991.

Primary Examiner—Georgia Y. Epps
Attorney, Agent, or Firm—Michael W. Sales; Wanda K. Denson-Low

[57] ABSTRACT

A quasi-resonant diode drive current source provides high power pulsed current that drives light emitting diodes, and the like. The pulsed output current of the quasi-resonant diode drive current source is sensed, and is regulated by a control loop to a level required by the light emitting diodes. In a specific embodiment of the invention, a zero-current-switched full wave quasi-resonant buck converter is described that provides a high amplitude pulsed output current required to drive light emitting pump diodes used in a solid state diode pumped laser. The use of a quasi-resonant converter as a pulsed current source provides a much higher conversion efficiency than conventional laser current sources. This higher efficiency results in less input power drawn from a power source and cooler operation, resulting in a higher reliability current source.

7 Claims, 6 Drawing Sheets

QUASI-RESONANT DIODE DRIVE CURRENT SOURCE

BACKGROUND

The present invention relates generally to diode drive current sources, and more particularly, to a quasi-resonant diode drive current source for use in powering solid state lasers.

Current controlled quasi-resonant converters are known in the motor art and once such converter is disclosed in "A Current-Controlled Quasi-Resonant Converter for Switched-Reluctance Motor", by Hoang Le-Huy, published in IEEE Transactions on Industrial Electronics, Vol. 38, No. 5, Oct. 1991. This paper discloses a current controlled quasi-resonant converter for use with low and medium power variable speed drives employing switched reluctance motors. Zero current switching is employed to improve the switching performance and to provide effective control of the current in the motor windings.

In addition, quasi-resonant converters are also discussed in a paper entitled "Multi-Loop Control for Quasi-Resonant Converters," by Raymond B. Ridley, published in IEEE Transactions on Power Electronics, Vol. 6, No. 1, January 1991. This paper discloses a multi-loop control scheme for quasi-resonant converters, and describes various quasi-resonant buck converter topologies and circuits.

With regard to the laser art, diode pumping has become the choice for use with solid state laser systems due to its higher electrical-to-optical efficiency. Prior to the use of diode pumping, flashlamps were used as pump sources. Typical system efficiencies were in the 1% to 2% range. The low efficiency was due mainly to the low electrical-to-optical efficiency. The use of diode pumping, with its higher electrical-to-optical efficiency, can result in a laser system efficiency of 10%, to 15%. Thus, a tenfold reduction in required input power can be achieved.

Diode pumping requires high power, pulsed, regulated current sources to drive the pump diodes. Conventional current sources utilize either a series dissipative regulator or a pulse-width-modulated (PWM) converter to control output current. When used at high output currents, as is required by diode pumped lasers, for example, both of these techniques suffer from high power losses, and are thus very inefficient.

The series dissipative regulator dissipates power dropped across a series pass element, typically a transistor, and the power is given by $P = (V_{in} - V_{out}) * I_{out}$. At high output currents, the power loss is very high. The PWM converter suffers from high switching losses in its switch transistor, particularly due to reverse recovery of a catch diode, and from switching losses in the catch diode. At high output currents, the reverse recovery currents are very large, and the resulting power losses are very high.

Therefore, it would be an advance in the art to have a current source that is relatively efficient and is capable of providing high power pulsed regulated current to solid state diode pumped lasers, and the like.

SUMMARY OF THE INVENTION

In accordance with the principles of the present invention, a quasi-resonant diode drive converter is used as a pulsed high power current source that is used to drive light emitting diodes, and the like. The present diode drive current source may be employed to drive solid state light emitting diodes used to pump a solid state laser, for example. The output current of the quasi-resonant diode drive converter is sensed, and is regulated by a control loop to a level required by the light emitting diodes. In a specific embodiment of the invention, a zero-current-switched full wave quasi-resonant buck converter was developed to provide a pulsed high amplitude output current required to drive a plurality of light emitting diodes that pump a laser crystal in a solid state diode pumped laser.

More specifically, one embodiment of the present invention comprises a current source that includes a power source, a light emitting diode, a quasi-resonant converter coupled between the power source and the light emitting diode that provides pulsed current to the diode. A current sensor is provided for sensing current flowing through the light emitting diode, and a controller is coupled to the current sensor for regulating the amplitude of the pulsed current supplied to the light emitting diode.

In addition a laser drive circuit is also disclosed that comprises a charge supply, and a plurality of charge storage devices coupled to the charge supply for storing charge. A plurality of light emitting diode arrays that each contain individual pluralities of light emitting diodes that are coupled to the charge storage devices. A plurality of diode driver circuits are respectively coupled to the plurality of light emitting diode arrays, and herein each of the plurality of diode driver circuits comprises a quasi-resonant diode drive pulsed current source, such as the one summarized in the preceding paragraph.

The use of a quasi-resonant diode drive converter as a current source provides a much higher conversion efficiency than conventional laser current sources. This higher efficiency results in less input power drawn from a power source and cooler operation, resulting in a higher reliability current source. The improved efficiency is a great benefit at high output current levels and it represents a very large savings in dissipated power. The present invention is an important development for the field of solid state diode pumped lasers, which require a high current, regulated, pulsed current source. Without such an efficient power source, diode pumped lasers would not be practical.

BRIEF DESCRIPTION OF THE DRAWINGS

The various features and advantages of the present invention may be more readily understood with reference to the following detailed description taken in conjunction with the accompanying drawings, wherein like reference numerals designate like structural elements and in which.

DETAILED DESCRIPTION

Figure 1:
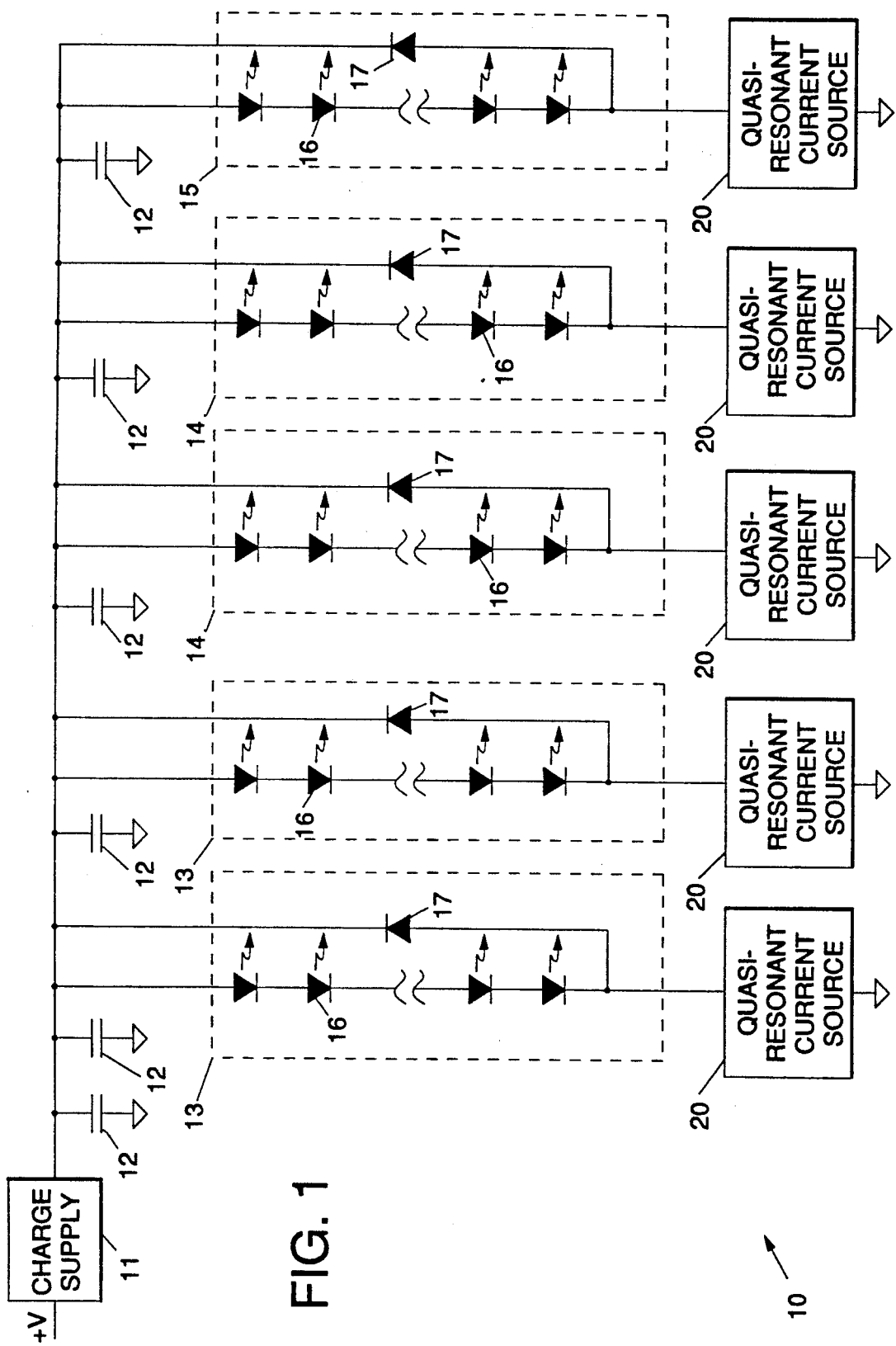
FIG. 1 illustrates a block diagram of a laser diode drive circuit that employs quasi-resonant diode drive current sources of the present invention.

Referring to the drawings figures, FIG. 1 illustrates a block diagram of a laser diode drive circuit 10 that employs quasi-resonant diode drive current sources 20 in accordance with the present invention to drive a plurality of laser diode arrays 13, 14, 15 that have varying numbers of light emitting diodes 16 therein. Each of the individual laser diode arrays 13, 14, 15 are adapted to pump laser crytals (not shown) that are part of two amplifiers and an oscillator (not shown). Each of the individual laser diode arrays 13, 14, 15 contains separate pluralities of laser diodes 16 that are coupled in series between a charge supply 11 and one of the quasi-resonant diode drive current sources 20. A protection diode 17 is coupled around each of the pluralities of light emitting diodes 16 and is used to protect the plurality of light emitting diodes 16 in case of a reverse voltage situation. Capacitive isolation is provided between respective ones of the pluralities of laser diodes 16 by means of capacitors 12. The capacitors 12 are used to store charge that is eventually controlled by the quasi-resonant diode drive current sources 20 to energize the laser diode arrays 13, 14, 15. Heretofore, conventional diode driver circuits have been used in a circuit similar to FIG. 1 in place of the diode drive circuits 20 (illustrated in detail in FIG. 2), and an example of a conventional drive circuit is model 778 manufactured by Analog Modules, Inc.

Figure 2:
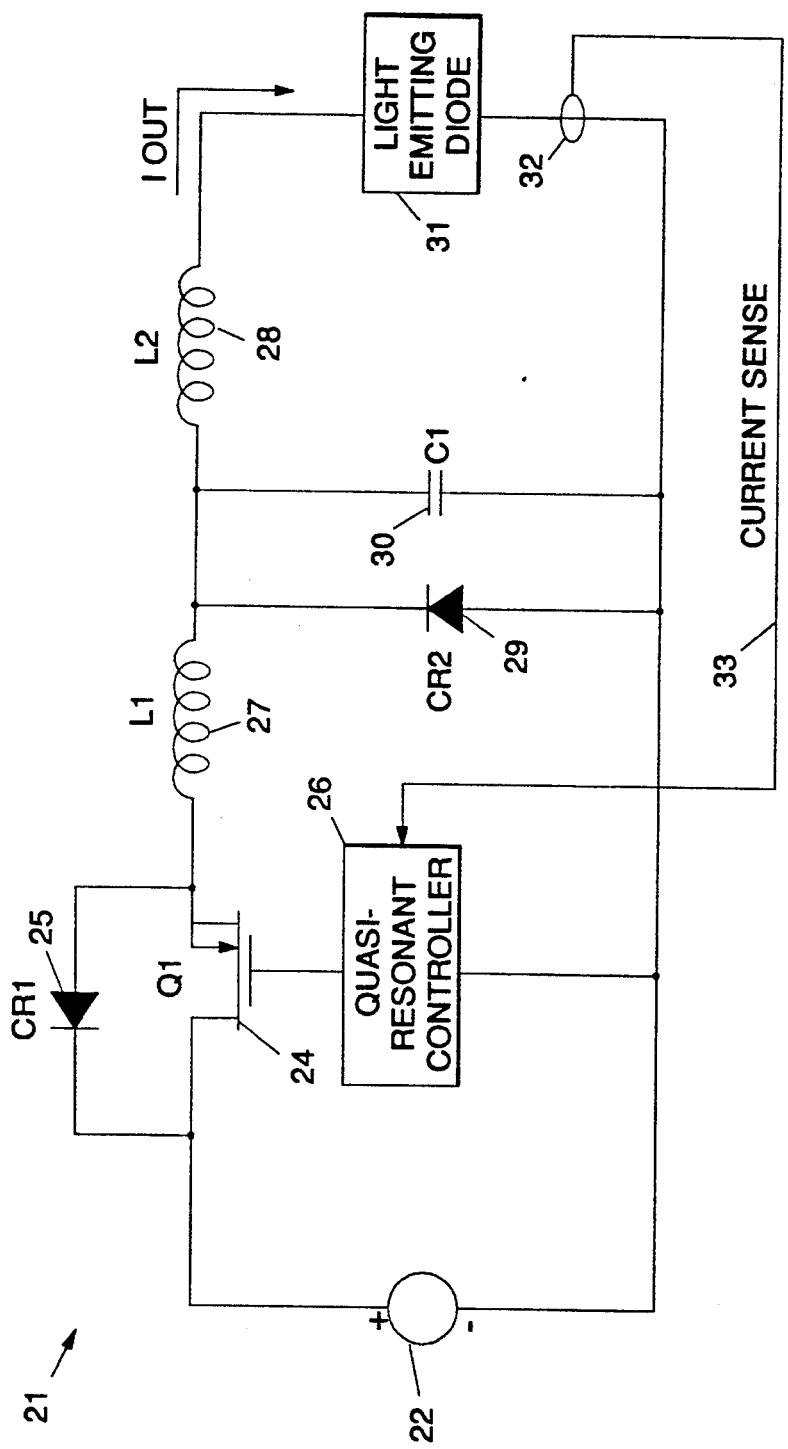
FIG. 2 shows a simplified schematic of the quasi-resonant diode drive current source in accordance with the principles of the present invention.
Figure 3A:
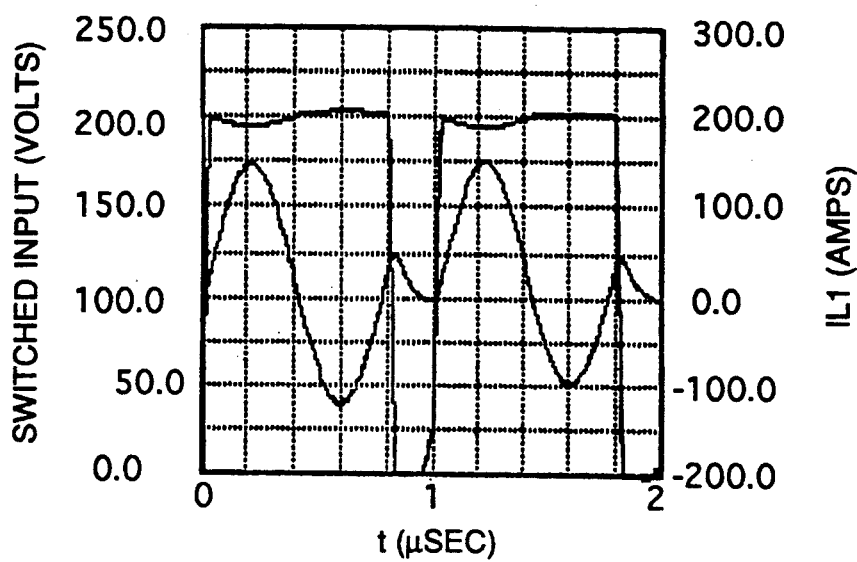
FIGS. 3a–3d show operating waveforms for the quasi-resonant diode drive current source of FIG. 2.
Figure 3B:
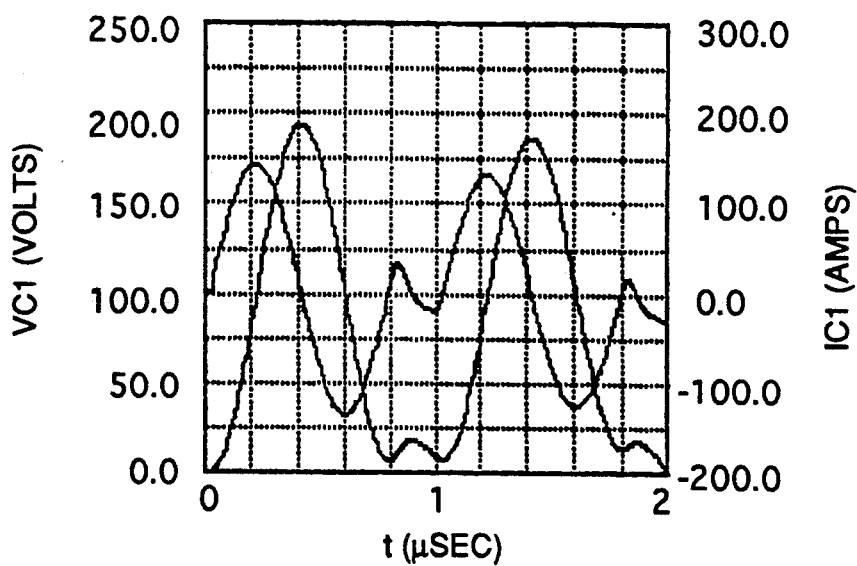
Figure 3C:
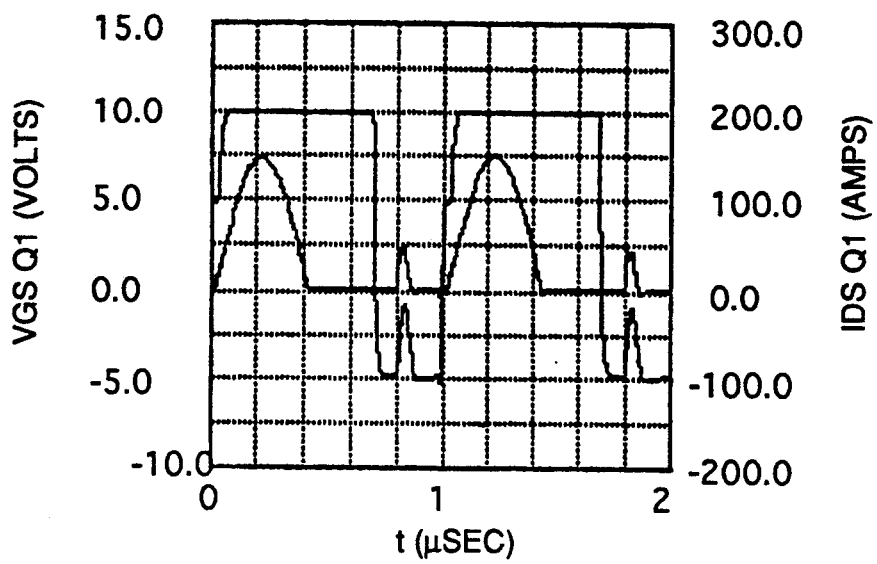
Figure 3D:
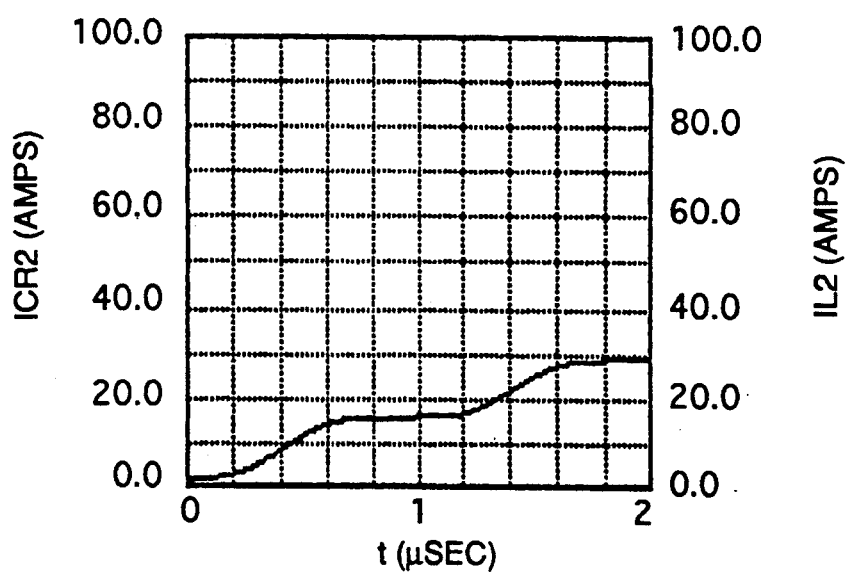
Figure 4A:
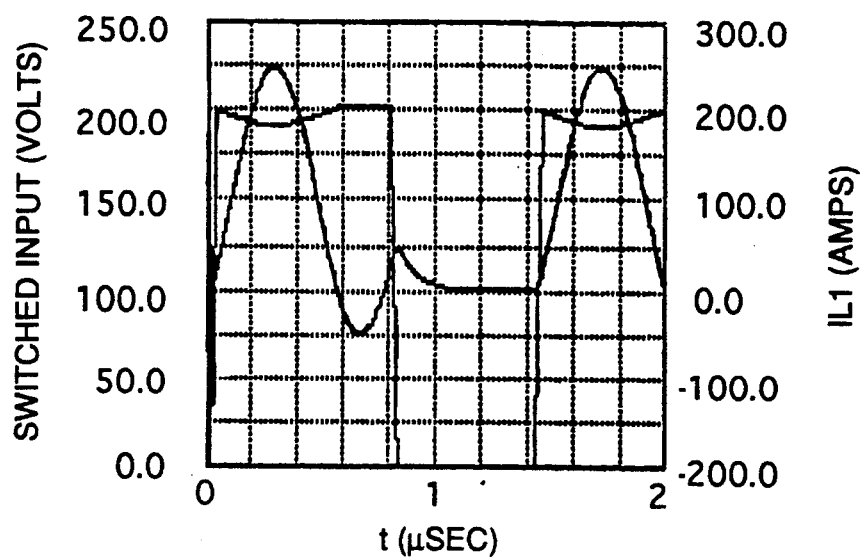
FIGS. 4a–4d show steady state operating waveforms for the quasi-resonant diode drive current source of FIG. 2.
Figure 4B:
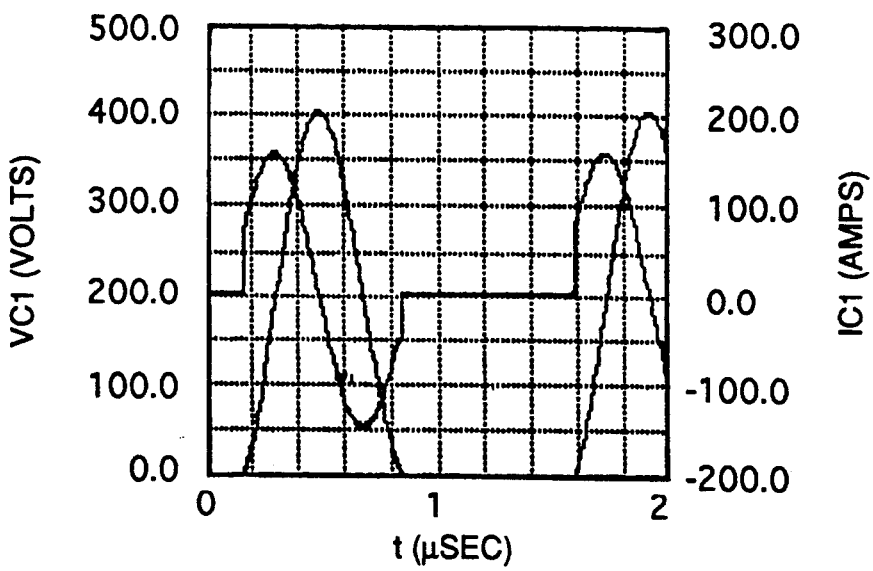
Figure 4C:
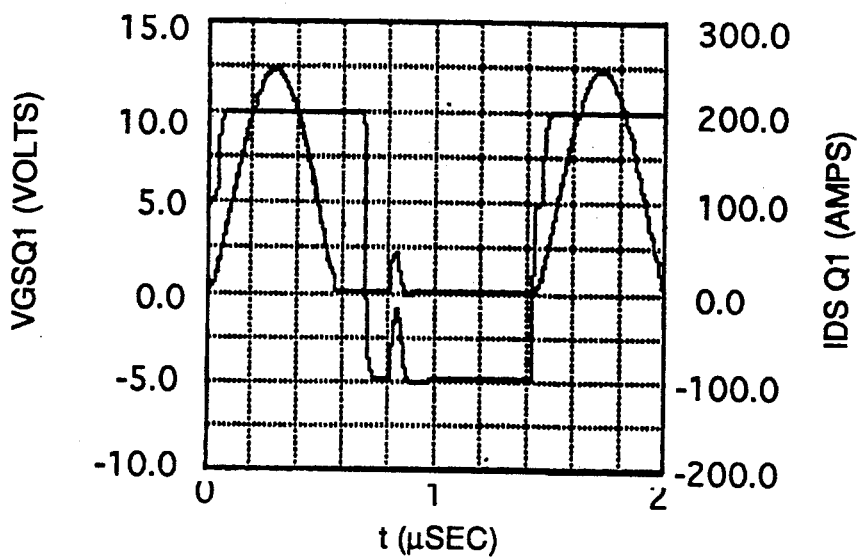
Figure 4D:
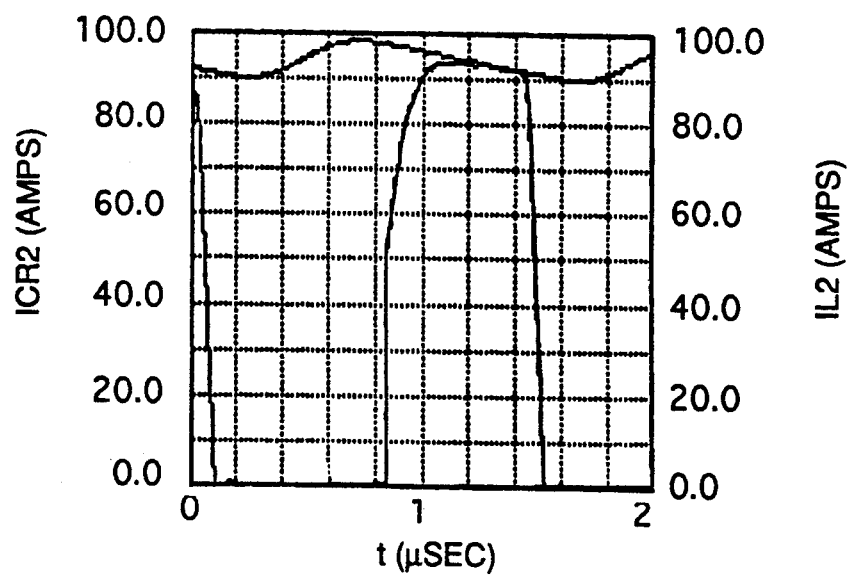

FIG. 2 shows a simplified schematic of the quasi-resonant diode drive current source 20 in accordance with the present invention that is employed as each of the diode drive circuits 10 in FIG. 1. A zero-current-switched full-wave buck converter is illustrated in FIG. 2. However it is to be understood that the quasi-resonant diode drive current source 20 of the present invention may be readily configured in accordance with other converter topologies.

As discussed above, switching losses in a conventional buck converter current source generate very high power losses, and such a circuit is very inefficient as a current source. Therefore, a power conversion technique that minimizes switching losses is desired, and is provided by the quasi-resonant diode drive current source 20 shown in FIG. 2. The diode drive current source 20 is a zero-current-switched quasi-resonant converter 21. This converter 21 makes use of component parasitics, or at a minimum, masks component parasitics, such that their effect is negligible.

The zero-current-switched quasi-resonant converter 21 is comprised of a power source 22 that is serially coupled through a switch transistor 24 (Q1), a resonant inductor 27 (L1), and a filter inductor 28 (L2) to a light emitting diode 31. Conventional power supply filtering (not shown) may be readily employed in the circuit of FIG. 2. A diode 25 (CR1) is coupled across the switch transistor 24. A catch diode 29 (CR2) and a resonant capacitor 30 (C1) are coupled from a point between the inductors 27 (L1), 28 (L2) and the negative side of the power supply. A current sensor 32 senses the output current coupled to the light emitting diode 31 and is coupled by way of a sense line 33 to a quasi-resonant controller 26 that regulates the amount of average current flowing through the switch transistor 24 (Q1), by varying the switching frequency.

The resonant inductor 27 (L1) provides a high impedance for the switch transistor 24 (Q1) during the switching time, and thus permits lossless switching of the switch transistor 24 (Q1). The resonant capacitor 30 (C1) masks the capacitance and reverse recovery of the catch diode 29 (CR2), and thus negates the switching losses of the catch diode 29 (CR2). This configuration provides essentially lossless switching. Detailed circuit descriptions of resonant converters are available in the published literature. In particular, an understanding of quasi-resonant converters may be had from a reading of the "Linear Integrated Circuits Data and Applications Handbook," publication number IC600, published April 1990 by Unitrode Integrated Circuits Corporation.

A detailed description of the operation of the quasi-resonant current source 20 is presented below, with reference to FIGS. 3a–3d which show the circuit operating waveforms. Assume zero initial conditions. The switch transistor 24 (Q1) is turned on, and applies the input voltage across the resonant inductor 27 (L1). Since the resonant inductor 27 (L1) is in series with the switch transistor 24 (Q1), the rise in current (di/dt) is limited by $V_{in}/L1$, and the switch transistor 24 (Q1) switches on with essentially zero collector/drain current. Switching loss is zero. Now the input voltage is applied to the low impedance tank circuit comprising the resonant inductor 27 (L1) and the resonant capacitor 30 (C1), a very underdamped LCR circuit. From turn on, input current rises and rings sinusoidally in the tank circuit through the switch transistor 24 (Q1). The resonant capacitor 30 (C1) is charged, due to the input current, to $2*V_{in}$. Input current now continues the ring cycle, flowing back into the source through the diode 25 (CR1). The resonant capacitor 30 (C1) is discharged, due to the reverse current flow. The switch transistor 24 (Q1) is turned off during the time that the resonant capacitor 30 (C1) is discharged. Since there is no current flow through the switch transistor 24 (Q1) during this time period, turn off of the switch transistor 24 (Q1) is also lossless. Input current then rings to zero, and the diode 25 (CR1) turns off. To begin the next cycle, the switch transistor 24 (Q1) is again turned on, and the process is repeated. The resonant capacitor 30 (C1) is charged (and discharged) once each cycle.

As the cycle is repeated, the output filter inductor 28 (L2) begins to flow current. The charging of the resonant capacitor 30 (C1) discussed above applies a voltage across the filter inductor (L2) 28 through the impedance of the light emitting diode 31. The rate of current rise (di/dt) in the inductor is proportional to the voltage (VC1) applied to the resonant capacitor 30 (C1) times the cycle rate. Therefore, the current in the inductor, and therefore light emitting diode current, is controlled by varying the frequency at which the switch transistor 24 (Q1) is switched. The output current is sensed, and the control loop varies the operating frequency to regulate the output current.

Operation at a steady state output current is only slightly different than described above. Reference is made to FIGS. 4a–4d which illustrate the steady state operating waveforms of the quasi-resonant diode drive current source 20. Prior to the time shown in FIGS. 4a–4d, the converter has reached steady state operation. The switch transistor 24 (Q1) is off, input current ($I_{in}$) is zero, the voltage (VC1) across the resonant capacitor 30 (C1) is zero (actually one diode drop below zero), output current ($I_{out}$) flows through the filter inductor 28 (L2) and the catch diode 29 (CR2). As the output current is sensed 32 and drops, the switch transistor 24 (Q1) is turned on. Iout continues to flow through the resonant inductor 27 (L1) and the diode 25 (CR1), the voltage (VC1) remains at zero volts. With the input voltage ($V_{in}$) impressed across the resonant inductor 27 (L1), Iin rises linearly to Iout. Soon thereafter, $I_{in} > I_{out}$, and current now flows into the resonant capacitor 30 (C1), beginning the resonant ring. The resonant inductor 27 (L1) and the resonant capacitor 30 (C1) ring, first flowing current into the resonant capacitor 30 (C1), then flowing current back to the source through the diode 25 (CR1). Now the output current acts as a damping resistor to the resonant tank, and the current through the diode 25 (CR1) is much less than at start-up. When the voltage (VC1) reaches zero volts, $I_{out}$ again flows through the catch diode 29 (CR2). When $I_{in}$ rings back to zero, the cycle is completed.

The quasi-resonant diode drive current source 20 has been simulated using conventional SPICE-based analysis. This simulation generated the waveforms shown in FIGS. 3 and 4. The simulation results illustrate the functions and advantages discussed above.

A breadboard of the quasi-resonant diode drive current source 20 has been built and tested. Performance of the breadboard closely matches predicted performance. Efficiency measurements have been performed, and the calculated efficiency is on the order of 85%–90%, and it is anticipated that the conversion efficiency of the quasi-resonant current source 20 may be improved to approximately 95%.

Thus there has been described a new and improved quasi-resonant current source for use in powering solid state lasers. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A current source comprising:
   a power source;
   a light emitting diode;
   a quasi-resonant converter coupled between the power source and the light emitting diode for providing pulsed current to the light emitting diode;
   sensing means for sensing current flowing through the light emitting diode; and
   control means coupled to the sensing means for regulating the amplitude of the pulsed current supplied to the light emitting diode.

2. The current source of claim 1 wherein the quasi-resonant converter comprises a zero-current-switched full wave quasi-resonant buck converter.

3. The current source of claim 2 wherein the quasi-resonant converter comprises:
   a switch transistor wherein a diode is coupled across said switch transistor;
   a resonant inductor in series with said switch transistor;
   a filter inductor connected in series with the light emitting diode and the current sensing means; and
   a resonant capacitor and a catch diode coupled in parallel across said filter inductor and said light emitting diode.

4. A laser drive circuit comprising:
   a charge supply;
   charge storage means coupled to the charge supply for storing charge;
   a plurality of light emitting diode arrays that each contain individual pluralities of light emitting diodes coupled to the charge storage means;
   a plurality of diode driver circuits respectively coupled to the plurality of light emitting diode arrays, and wherein each of the plurality of diode driver circuits comprises a quasi-resonant diode drive pulsed current source.

5. The laser drive circuit of claim 4 wherein each quasi-resonant diode drive current source comprises:
   a quasi-resonant converter coupled between the charge storage means and a selected one of the plurality of light emitting diode arrays for providing pulsed current to the light emitting diodes of the arrays;
   sensing means for sensing current flowing through the selected light emitting diode array; and
   control means coupled to the sensing means for regulating the amplitude of the pulsed current supplied to the selected light emitting diode array.

6. The laser drive circuit of claim 5 wherein the quasi-resonant converter comprises a zero-current-switched full wave quasi-resonant buck converter.

7. The laser drive circuit of claim 6 wherein the quasi-resonant converter comprises:
   switching means coupled between the charge storage means and a selected one of the plurality of light emitting diode arrays;
   a resonant inductor and a filter inductor serially coupled between the switching means and the selected one of the plurality of light emitting diode arrays;
   a catch diode and a resonant capacitor coupled across the filter inductor and the selected one of the plurality of light emitting diode arrays.

* * * * *